(12) United States Patent
Schilling

(10) Patent No.: US 6,202,553 B1
(45) Date of Patent: Mar. 20, 2001

(54) PROCESS FOR PRODUCING A SCREEN PRINTING FORM AND SCREEN PRINTING FABRIC OF A COATED SCREEN WEB

(75) Inventor: Christian Schilling, Seuzach (CH)

(73) Assignee: Sefar AG, Thal (CH)

( * ) Notice: Subject to any disclaimer, the term of this patent is extended or adjusted under 35 U.S.C. 154(b) by 0 days.

(21) Appl. No.: 09/214,674

(22) PCT Filed: Jul. 15, 1997

(86) PCT No.: PCT/EP97/03785

§ 371 Date: Aug. 2, 1999

§ 102(e) Date: Aug. 2, 1999

(87) PCT Pub. No.: WO98/02785

PCT Pub. Date: Jan. 22, 1998

(30) Foreign Application Priority Data

Jul. 16, 1996 (DE) .............................................. 196 28 616
Nov. 14, 1996 (DE) .............................................. 196 46 987

(51) Int. Cl.[7] ...................................................... B41N 1/14
(52) U.S. Cl. ...................................... 101/128.21; 118/325
(58) Field of Search .................................. 101/127, 127.1, 101/128.1, 128.21, 128.4; 118/213, 301, 325, 406

(56) References Cited

U.S. PATENT DOCUMENTS

| | | | |
|---|---|---|---|
| 4,668,329 | * | 5/1987 | Shirataki .......................... 101/128.21 |
| 4,860,467 | * | 8/1989 | Larson ................................ 101/127.1 |
| 4,975,136 | * | 12/1990 | Seki et al. .......................... 101/128.4 |
| 5,136,939 | * | 8/1992 | Simmons ............................... 101/127 |
| 5,232,544 | * | 8/1993 | Sumi ................................. 101/128.4 |
| 5,233,918 | * | 8/1993 | Hale ................................. 101/128.4 |
| 5,306,376 | * | 4/1994 | James ................................ 101/128.1 |
| 5,384,007 | * | 1/1995 | Fischer .............................. 101/128.4 |
| 5,562,030 | * | 10/1996 | Karlyn et al. ...................... 101/128.4 |
| 5,645,975 | * | 7/1997 | Gybin et al. ....................... 101/128.4 |
| 5,944,896 | * | 8/1999 | Landesman et al. ................ 118/500 |

FOREIGN PATENT DOCUMENTS

595776 * 5/1994 (EP) .

* cited by examiner

Primary Examiner—Stephen R. Funk
(74) Attorney, Agent, or Firm—Bachman & LaPointe, P.C.

(57) ABSTRACT

In a process for the production of a screen printing form comprising a grid-like screen web with a coating of an emulsion, in particular a photosensitive emulsion, a screen web is partially provided with at least one coating area which is composed of a plurality of separately applied coating regions. Preferably the emulsion is applied in a plurality of mutually parallel adjacent coating strips of defined width by at least one nozzle.

48 Claims, 5 Drawing Sheets

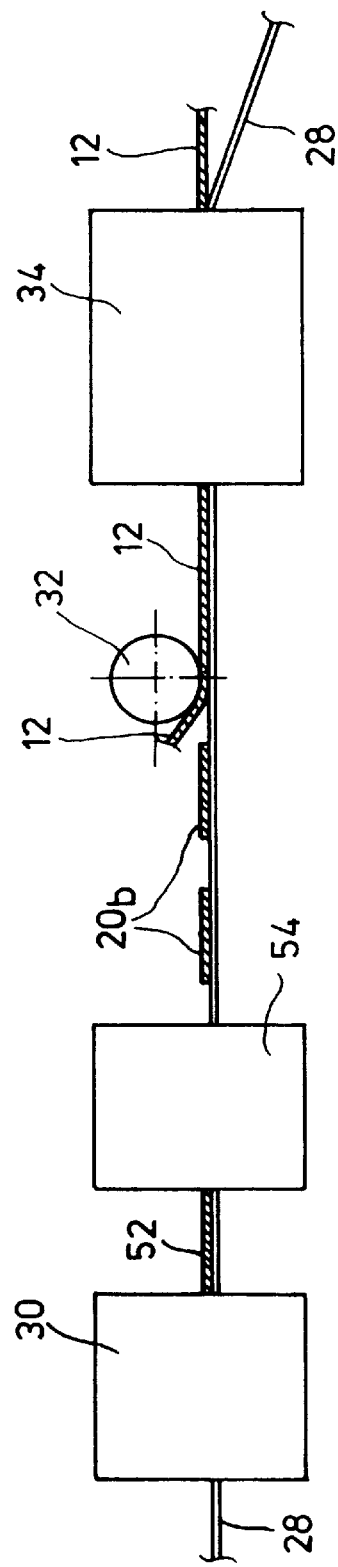
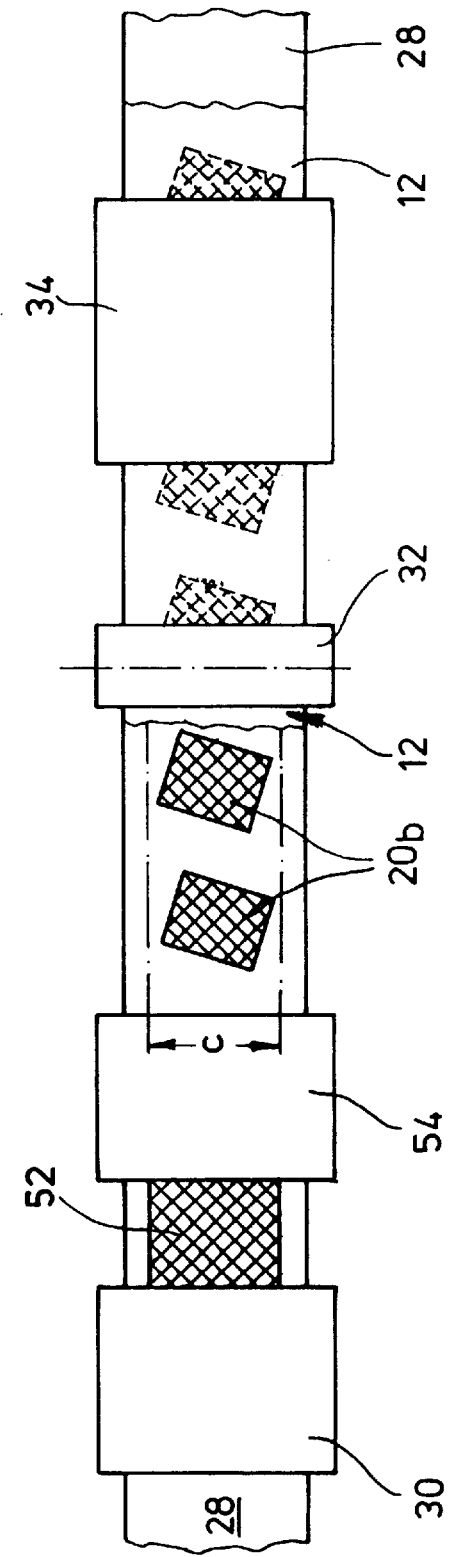

PROCESS FOR PRODUCING A SCREEN PRINTING FORM AND SCREEN PRINTING FABRIC OF A COATED SCREEN WEB

BACKGROUND OF THE INVENTION

The invention concerns a process for the production of a screen printing form comprising a screen web, for example of plastic filaments, by coating with an emulsion which in particular is photosensitive. The invention also concerns a screen printing form comprising a coated screen web.

Centuries after it was first used in China the screen printing process has been known in Europe approximately since the 19th Century, a fine-mesh textile cloth or wire mesh material is stretched out in a screen printing frame and covered in the image-free regions by a stencil, so as to be impermeable to ink. Besides manual cut stencils—for example for labelling or writing—nowadays preferably photographically produced direct or indirect stencils are the usual practice; the choice of the kind of stencil adopted—in the case of direct stencils those with emulsion, with direct film and emulsion or with direct film and water—is left to the discretion of the screen printer.

A plurality of steps are usually required to produce a screen printing form. Firstly a screen printing cloth is stretched out over a clamping frame of light metal or alloy, wood or the like, and is glued to the frame in its stretched position. The cloth is then coated with photosensitive emulsion, for example using a coating channel manually or by machine using an automatic coating apparatus. As the coating thereon cannot be produced exactly as far as the inward side of the frame, the remaining surface area must be subsequently sealed off using screen filler. The coated surface is now exposed by means of a copy original (film) corresponding to the print image. The regions of the print image which are not exposed are washed out. The operation of drying the stencil is followed by the retouching operation and the operation of covering over the edges with screen filler.

It has been found inter alia difficult to produce an exact flat layer surface on the screen cloths which are usually produced employing a so-called taffeta weave. Due to the low proportion of solids—usually below 50%—in the emulsion the layer sinks down into the mesh openings of the cloth in the subsequent drying procedure, whereby the surface may exhibit a certain degree of roughness. For certain areas of use, that surface quality may be sufficient, but for higher levels of quality requirement, at least one further coating operation is required.

If a plurality of small frames are to be covered with the cloth—for example for producing print images of small surface area—, the procedure involves the use of a so-called mother frame, and the screen cloth is stretched out thereon; it is held to the mother frame for example by clamping clips which are described in the present applicants' EP 0 650 832 A1. The smaller screen printing frames are put on to a support and the screen web which is held under tension is fitted thereover.

A process for the production of photochemically coated material for screen printing cylinders is disclosed in German laid-open application DE 3441593A. In that procedure a chromium steel wire mesh of suitable mesh size is coated with nickel electrolytically, chemically or by vapour deposition, to such an extent that the points of intersection of the cloth are fixed in such a way that no movement is possible; the stabilized material is then coated with at least one layer comprising a photosensitive emulsion by applying that emulsion to a flat surface and embedding the cloth into the rear side of the layer of emulsion and joining same by applying a further layer of emulsion, so that the result is a flat copying layer on the surface of the screen printing stencil, which is at the printing side.

U.S. Pat. No. 3,834,348A describes a clamping frame—which is variable in width—with a cloth portion fixed therein using clamping elements. Displaceable over the cloth portion is a channel for a viscous fluid or an emulsion, the latter flowing out of adjacent slots in the wall of the channel on to the cloth portion in order to form a coating thereon. The coating is then dried or hardened on the cloth portion.

JP 5 216 239A discloses a container with a clamping frame in which a cloth is coated with a photosensitive film. The fluid is introduced into the container until a desired layer thickness has been produced on the cloth. The fluid is then partially exposed; the unexposed regions are removed after termination of the treatment so as to result in an image.

SUMMARY OF THE INVENTION

The foregoing object is attained by the teaching of the independent claims; the appendant claims set forth advantageous configurations.

In accordance with the invention a screen web is partially provided within a predetermined outline contour with coating areas comprising the emulsion, wherein the emulsion is applied preferably in web form or also in point form to the screen web. It is advantageous to use at least one nozzle for the application procedure, which nozzle is guided parallel to the longitudinal direction of the screen web over the screen cloth and produces laterally mutually adjoining coating strips which together give the coating area.

The coating areas can be produced in different ways. On the one hand—in the case of low levels of requirement, rough surface—they can be applied directly to the screen web and then dried. It is also possible for those coating areas which are applied directly to the screen web to be lined with a protective foil and only then moved to the drying station; that is done in particular when the situation involves high levels of requirement and a good roughness value on the Z-axis. It is particularly advantageous however for the coating areas to be produced on a strong stable carrier material and for the latter to be fed with the wet emulsion regions to the screen web; those emulsion regions are then transferred on to the screen web and subsequently dried. Then, the carrier material is drawn off or however provisionally kept as a protective foil on the screen web.

It is in accordance with the invention for a center line of the coating area produced—defined by its preferably four contour lines—to include an angle of inclination with a longitudinal edge of the screen web; the contour lines are turned about the center of the coating area through that angle, which is preferably less than 45°.

In accordance with the invention, application of the coating areas at an angle of inclination relative to the screen web permits the coated cloth portions to be stretched out in an angled position on a clamping frame. Cloths which are stretched out in an angled condition permit cleaner and tidier printing of lines which have to be printed parallel to the screen printing frame. The crucial consideration is that in that situation there is no parallelism between the yarn path of the screen cloth and the line to be printed.

A simplification in manufacture is achieved in particular when the coating area is composed of individual coating webs which are each produced by a respective nozzle or the like tool and which are adjacent in parallel relationship and the longitudinal edges of which blend into each other so that no contour strips which pass through the coating area remain.

In accordance with a further feature of the invention each narrow edge of the strip-like coating web is associated with a respective one of the contour lines of the coating area which is angled relative to the axis of the mother frame.

It is in accordance with the invention for the center line of a clamping frame associated with the coating area to be positioned on the center line of the contour of the coating area, which clamping frame is arranged at a spacing relative to the contour lines and is then glued to the screen web in the taut condition thereof outside the coating area. After the screen web regions which remain between the frame and the coating area have been covered over by an impermeable layer, a coated printing stencil, in particular for smaller surface areas, is produced in a simple fashion, wherein the number of contour lines of the polygonal coating area can be different.

In particular cases the coating areas can also be produced in another fashion; the screen web is provided at a surface with a continuous emulsion layer from which then the regions which do not belong to a predetermined pattern of the coating areas are removed.

It is particularly advantageous for those excessive zones of the coating to be sucked away immediately after the application thereof, that is to say with the emulsion in the moist condition.

BRIEF DESCRIPTION OF THE DRAWINGS

Further features, advantages and details of the invention will be apparent from the following description of preferred embodiments and with reference to the drawing in which:

FIG. 9 shows a diagrammatic view corresponding to the view shown in FIG. 2 of another installation, and FIG. 10 is a plan view of the FIG. 9 installation.

DETAILED DESCRIPTION OF THE EMBODIMENTS

Figure 1:
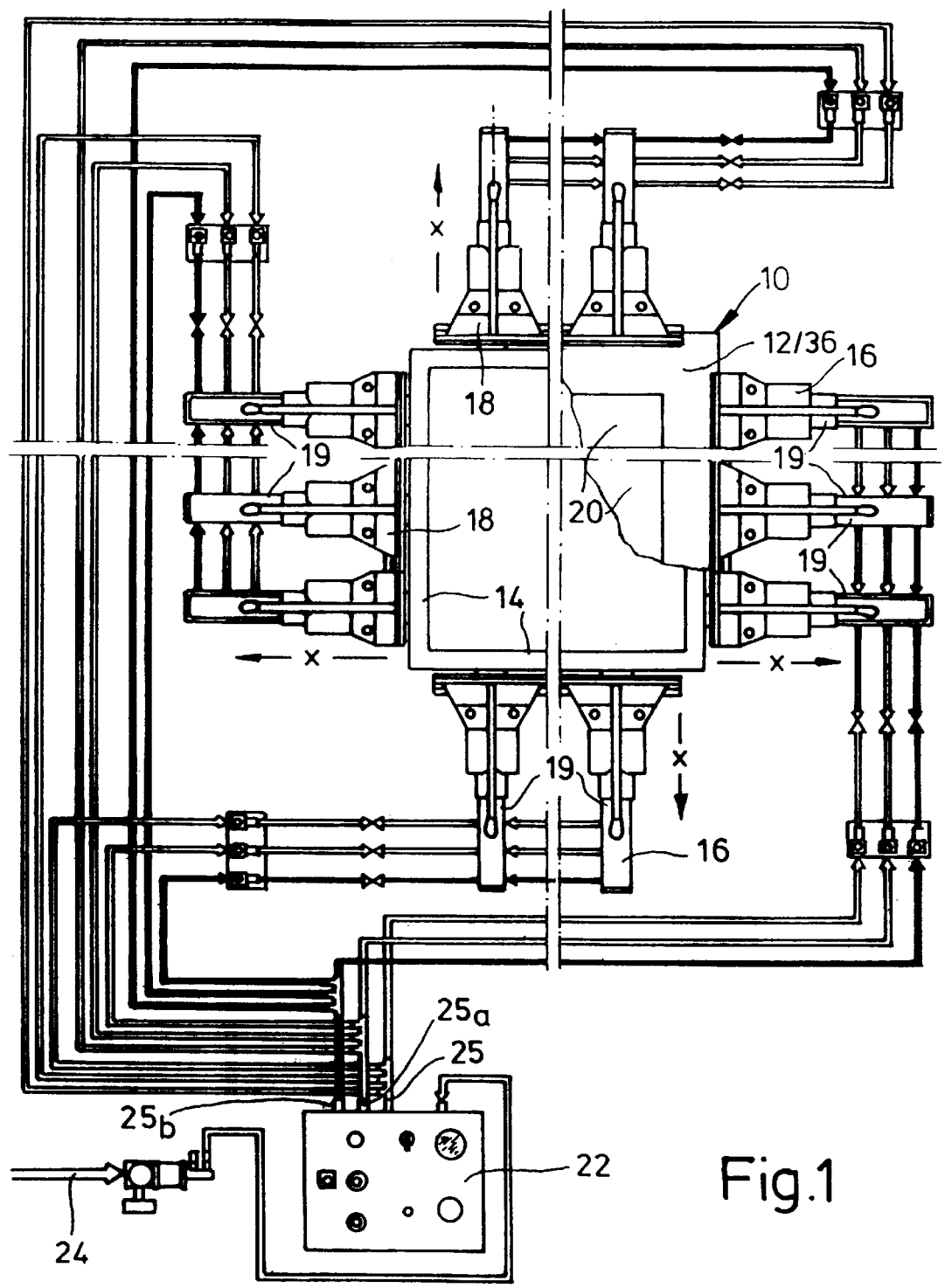
FIG. 1 is a plan view of an apparatus for stretching out a coated screen web period portion with groups of clamping devices.

An apparatus 10 for stretching out a rectangular fabric portion or a screen web 12 of preferably gauze-like screen material for use in the screen printing process has—along the four sides of a support frame 14—a plurality of clamping elements or clamping devices 16. They each engage, with a respective clamping jaw 18, a portion of the screen web 12 in the edge region thereof and tension the screen web 12 which is then fixed therearound by displacement of a respective pulling cylinder 19 in the pulling direction x. The screen web 12 whose surface is provided with coating areas 20 lies on the mother frame 14 and is drawn downwardly from the outside edge thereof towards the clamping jaw 18 in the closed position thereof at an angle (not shown) of about 6°.

Reference 22 denotes a control unit which is fed from a line 24 with compressed air at a maximum of 10 bars and from which three control lines 25, $25_a$, $25_b$ for the clamping devices 16 extend.

Figure 2:
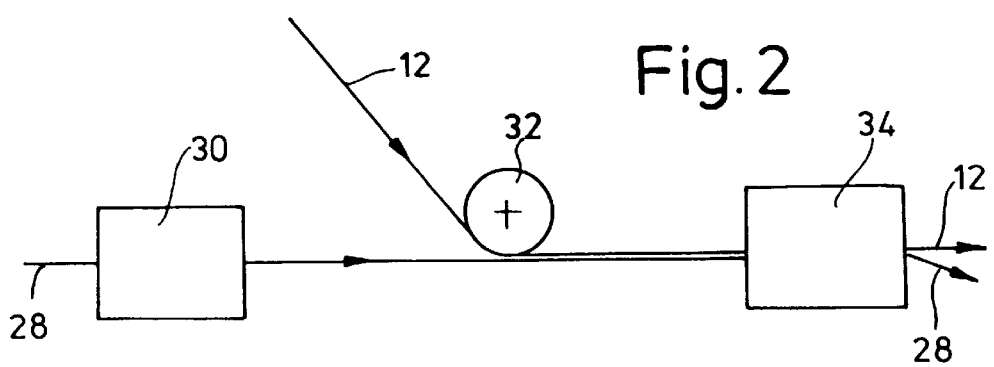
FIG. 2 is a diagrammatic side view of an installation for coating a screen web.

As shown in FIG. 2, fed to the screen web 12 is a web-like carrier material 28 which is coated in a coating station 30 in an application procedure to be described hereinafter, with regions of photosensitive emulsion which are not shown in the drawing for the sake of clarity thereof. Those regions correspond in regard to their dimensions and spacings relative to each other, for example to the coating areas 20 on the screen web 12 in FIG. 3. The carrier material 28 which is coated with those regions passes on to the screen web 12 at a lining station 32; under pressure, the layer of photosensitive emulsion is transferred on to the screen web 12 and then dried in a through-run station 34.

Downstream of the through-run station 34 the coating areas 20 are present in the configuration previously occurring on the carrier material 28, on the screen web 12, they can now be separated from the carrier material 28 or discharged with same as a temporary protective layer.

The drawing does not show a process operating procedure for coating areas which are applied to the screen web 12 directly—without any foil-like carrier material; in that case, downstream of the coating station 30, the screen web is immediately conveyed to the drying or through-run station 34 or upstream thereof it is provided with a protective foil which can be removed after the drying procedure.

Figure 3:
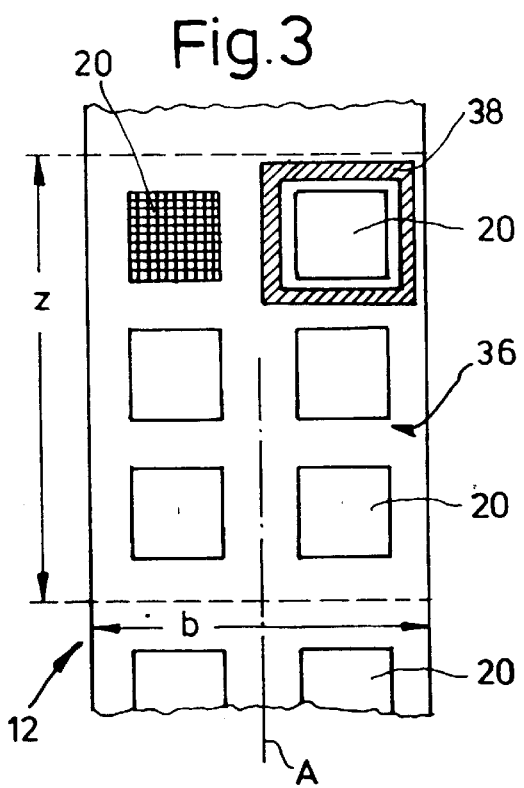
FIGS. 3 and 4 show plan views of a screen web with coating areas.

FIG. 3 diagrammatically shows a screen web 12 of the web width b with coating areas 20 which are arranged parallel to the longitudinal axis A thereof; six of the coating areas are provided within a so-called repeat or period portion 36 of the length z. One of those coating areas 20 is emphasized by grating hatching, for the sake of improved clarity thereof. Disposed by way of example around the coating area 20 which is arranged to the right of the hatched area is a clamping frame 38 to which that portion of the taut screen web 12 is then connected by an adhesive operation.

Figure 4:
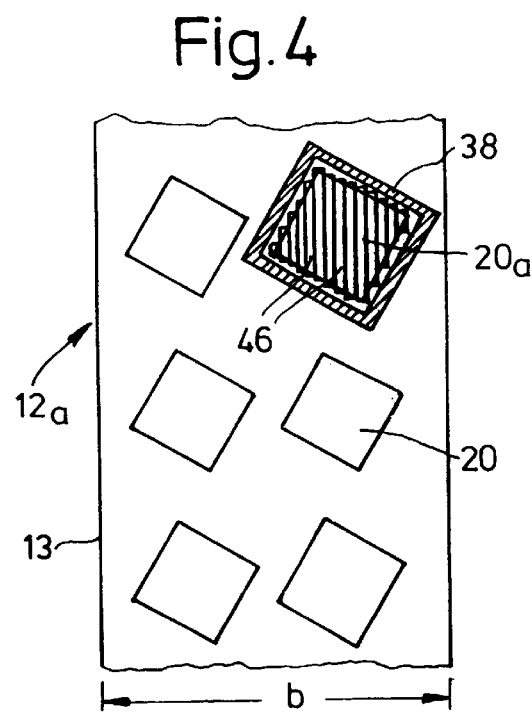
Figure 5:
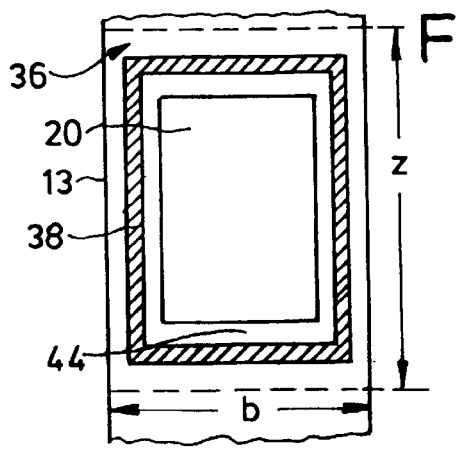
FIGS. 5 and 6 show other plan views of the screen web which is shown on a reduced scale in comparison with FIGS. 3 and 4.
Figure 6:
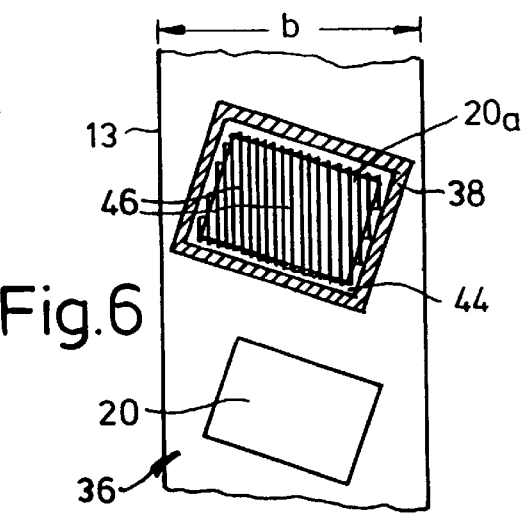

FIGS. 4 to 6 show further kinds of coating areas 20, $20_a$. The coating areas $20_a$ are composed of individual webs or strips 46 which are described in greater detail with reference to FIGS. 7 and 8; this involves coating strips 46 which in the coating operation are put on to the open cloth $12_a$ and which can no longer be seen after the coating area $20_a$ is finished, merging into same. The photosensitive coating is applied by means of a 'universal' nozzle in coating strips 46. The coating areas 20 are therefore tailored to size in relation to the respective use involved, as also applies in relation to FIG. 6.

FIGS. 4 to 6 also indicate smaller coating areas $20_a$ corresponding to those in FIG. 3, in a position of being inclined relative to the longitudinal axis A or the parallel longitudinal edges 13 of the web (FIG. 4), as well as larger coating areas 20, $20_a$ of which there is/are only one or two per repeat or period portion 36.

Figure 7:
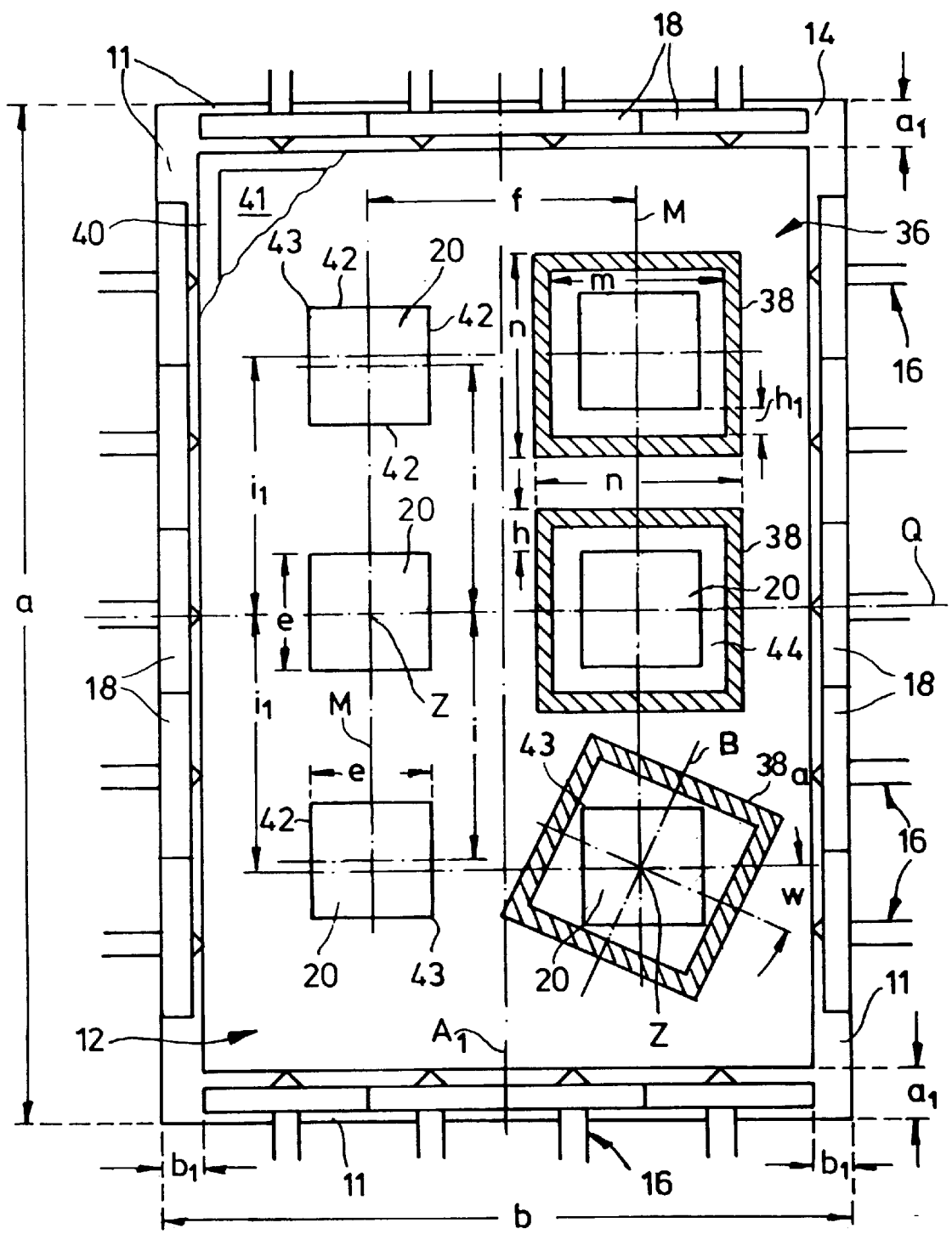
FIG. 7 shows a screen web on an enlarged scale in comparison with FIGS. 3 to 6 with a plurality of coated regions for associated clamping frames.
Figure 8:
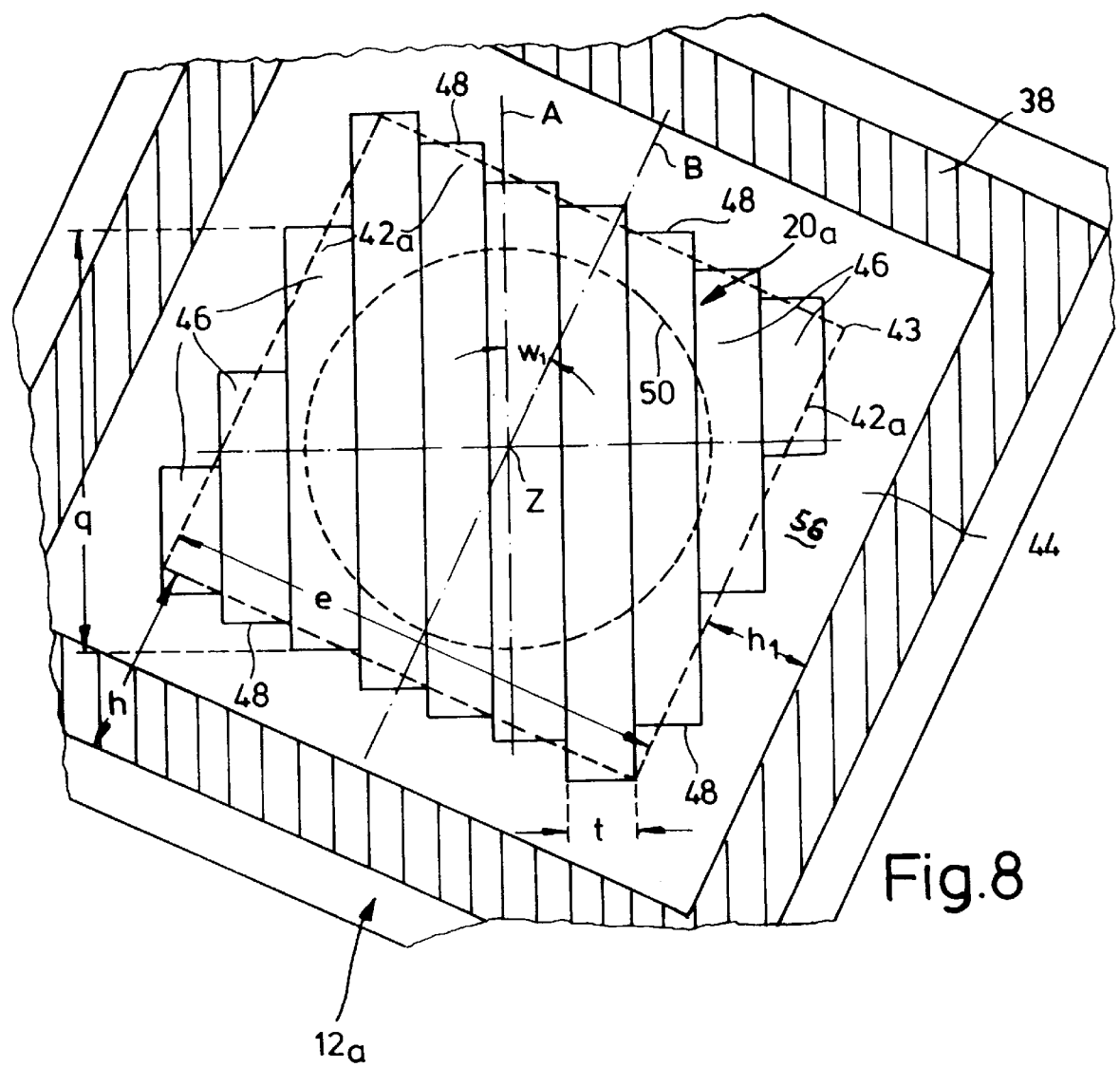
FIG. 8 shows a plan view on a larger scale than FIG. 7 of a coated region.

FIG. 7 shows a repeat or period portion 36 of a screen web 12 of the free web length a of here about 1400 mm and the free web width b of 900 mm with edge regions 11 of widths $a_1$ and $b_1$ respectively, associated with clamping elements 16. The repeat or period portion 36 is stretched out on a support frame 14. Disposed at top left is a mother frame 40 as an edging border of an auxiliary plate 41 of wood or plastic material; the clamping frames 38—which then have the repeat or period portion 36 positioned thereover—are positioned on the auxiliary plate 41 during the production procedure.

Shown on the free surface of the screen cloth or the screen web 12—to the left of the longitudinal axis $A_1$ of the mother frame 40—are three square coating areas 20 which are delimited by a contour with four contour lines 42, consisting of photosensitive emulsion—preferably of the kind set forth in the opening part of this specification—as a photosensitive coating of a width e of here 180 mm, which in the slack condition of the screen web 12 are arranged relative to each other at center spacings i of 380 mm—and $i_1$ of 394 mm in the taut condition. The spacing f of the center line M of those three coating areas 20, which center line is parallel to the longitudinal axis A of the system, relative to the—also parallel—center line M of a second row of coating areas 20 which can be seen to the right of the longitudinal axis $A_1$ corresponds to the center spacings i and $i_1$ respectively both in the taut and also in the slack condition. The central coating areas 20 of both rows of areas are disposed on the transverse axis Q of the mother frame 40, relative to which each two contour lines 42 of each of the square coating areas 20 are disposed in parallel relationship.

Each of the coating areas 20 is to be so arranged within the contour of a small clamping frame 38 which lies on the auxiliary plate 41 and is disposed beneath the screen web 12, in such a way that the clamping frame can be readily glued to a non-coated zone of the screen printing cloth, outside the coating area 20; in order to be able to apply the adhesive to the screen cloth 12 without affecting the coating area 20, a coating-free cloth edge portion 44 of a minimum width h should remain around the coating area 20—and in the glued condition, therearound, a free edge portion of a width $h_1$.

In order clearly to illustrate the described joining procedure involved, FIG. 7 shows by way of example coating areas 20 of printing stencils for direct printing on Compact Discs; diagrammatically shown on the right-hand side are the coating areas 20 within their clamping frame 38, wherein the lower frame $38_a$ or the frame center line B is turned out of the center line M through an inclination angle w of in this case 22.5° about the center point Z of the coating area 20, in such a way that the corners 43 of the coating area 20 are at a spacing—even if slight—relative to the insides of the frame; the inside length m of the clamping frame 38, $38_a$ is here 260 mm, with an outside length n of 310 mm.

The minimum width h of the above-mentioned cloth edge portion 44 is half the difference between the outside length n and the area width e. Half the difference thereof, relative to the inside length m, in turn gives the free edge width $h_1$.

The coating areas 20 are to be so arranged with their contours within their clamping frame 38, $38_a$ that they are disposed therearound at a spacing $h_1$, which can involve problems for example in the case of inclined arrangements in accordance with the frame $38_a$. For that reason, a coating area $20_a$ which is shown inter alia in FIG. 8, with any position of the frame center line B with an inclination angle w by way of example of 22.5° is produced by the emulsion that forms it being applied by an applicator member (not shown) guided parallel to the web longitudinal axis A—to the carrier material 28 described with reference to FIG. 2—in integral coating strips 46 of a small width t. The different lengths q of the coating strips 46 which are adjacent in parallel relationship are adapted to the respective position of the turned contour lines $42_a$ and the narrow edges 48 of each coating strip 46 touch different contour lines $42_a$. Disposed within them is a circle as the boundary 50 of the actual print image (not shown) for the Compact Disc.

Not shown in this connection is a construction in which the emulsion is applied approximately in punctiform manner within the contour lines $42_a$. The drawing shows a fluid-impermeable layer 56 which surrounds the coating area 20, $20_a$ and covers over the coating-free cloth edge portion 44.

FIGS. 9 and 10 represent an alternative which can possibly be used, to the above-described process. Here the carrier foil 28 is provided in the coating station 30 over its entire surface or in the form of a wide strip with a layer 52 of a width c consisting of that emulsion, and is then immediately passed through a suction removal station 54. In the station 54, individual coating areas $20_b$ are produced by suction removal of the layer regions which are not wanted, in regard to a preselectable pattern of the coating areas $20_b$.

What is claimed is:

1. A process for the production of a screen printing form comprising a screen web of plastic filaments, by coating with a photosensitive emulsion, characterized in that the screen web is partially provided with at least one coating area which is composed of a plurality of separately applied coating strips, wherein the emulsion is applied as the coating strips in an adjacent, substantially parallel relationship and are thereafter dried.

2. A process according to claim 1 characterized in that the emulsion is sprayed on approximately in point form.

3. A process according to claim 1 characterized in that the emulsion is applied by at least one nozzle which is guided parallel to a longitudinal edge of the screen web.

4. A process according to claim 1 a characterized in that the coating areas are applied to a web-like carrier material and are transferred from same on to the screen web, whereupon the latter is dried.

5. A process according to claim 4 characterized in that the web-like carrier material is pulled off the screen web carrying the coating areas.

6. A process according to claim 4 characterized in that the carrier material is joined as a protective foil to the screen web.

7. A process according to claim 1 characterized in that the center line of the coating area is oriented at an inclined angle relative to the longitudinal axis of the web, which is less than 30°.

8. A process according to claim 1 characterized in that the coating strips include an inclined angle with the center line of the coating area.

9. A process according to claim 8 characterized by an inclined angle of less than 30°.

10. A process according to claim 8 characterized in that each coating strip has a narrow edge which is associated with a respective contour line of the coating area.

11. A process according to claim 10 characterized in that the length of each coating strip is adapted to the position of the contour line which is determined by the inclined angle.

12. A process according to claim 10 characterized in that the center line of a clamping frame which is associated with the coating area and which is arranged at a spacing relative to the contour lines is put on to the center line of the contour of the coating area.

13. A process according to claim 12 characterized in that the clamping frame is glued to the screen web outside the coating area.

14. A process according to claim 12 characterized in that an impermeable layer which surrounds the coating area is applied to the screen web within the clamping frame.

15. A screen printing product comprising a screen web of plastic filaments, which is coated with a photosensitive emulsion, which has been produced according to the process of claim 1 characterized in that the screen web is provided with coating areas composed of a plurality of coating strips.

16. A screen printing product according to claim 15 characterized in that the coating areas are produced on a foil-like carrier material and transferred on to the screen web, the carrier material forming a protective foil.

17. A screen printing product according to claim 15 characterized in that the coating strips include an inclined angle to the center line of the coating area.

18. A screen printing product according to claim 15 characterized in that the coating strips extend at an inclined angle relative to the center line of a clamping frame receiving them.

19. A screen printing product according to claim 15 characterized in that the coating strips extend approximately parallel to the longitudinal axis of the screen web.

20. A screen printing product according to claim 15 characterized in that the screen web is provided with a liquid-impermeable layer of a cloth edge portion, said layer surrounding the coating area.

21. A process for the production of a screen printing form comprising a screen web of plastic filaments, by coating with a photosensitive emulsion, characterized in that the screen web is provided with a layer of the emulsion, producing a plurality of coating areas by subsequent removal of parts of the layer of emulsion and thereafter drying the screen web.

22. A process according to claim 21 characterized in that the layer of the emulsion is subdivided into the coating areas by partial suction removal.

23. A process according to claim 21 characterized in that the emulsion is sprayed on approximately in point form.

24. A process according to claim 21 characterized in that the emulsion is applied by at least one nozzle which is guided parallel to a longitudinal edge of a carrier.

25. A process according to claim 21 characterized in that the center line of the coating area is oriented at an inclined angle relative to the longitudinal axis of the web, which is less than 30°.

26. A process according to claim 21 characterized in that each coating area comprises a plurality of substantially parallel coating strips wherein the coating strips are at an inclined angle with the center line of the coating area.

27. A process according to claim 26 characterized by an inclined angle of less than 30°.

28. A process according to claim 26 characterized in that each coating strip has a narrow edge which is associated with a respective contour line of the coating area.

29. A process according to claim 28 characterized in that the length of each coating strip is adapted to the position of the contour line which is determined by the inclined angle.

30. A process according to claim 28 characterized in that the center line of a clamping frame which is associated with the coating area and which is arranged at a spacing relative to the contour lines is put on to the center line of the contour of the coating area.

31. A process according to claim 30 characterized in that the clamping frame is glued to the screen web outside the coating area.

32. A process according to claim 30 characterized in that an imperable layer which surrounds the coating area is applied to the screen web within the clamping frame.

33. A process for the production of a screen printing form comprising a screen web of plastic filaments, by coating with a photosensitive emulsion, characterized in that a web-like carrier material is provided with a layer of emulsion, producing a plurality of coating areas in the carrier material by subsequent removal of parts of the layer, and transferring the coating areas from the carrier material on to the screen web and drying.

34. A process according to claim 33 characterized in that the layer of the emulsion is subdivided into the coating areas by partial suction removal.

35. A process according to claim 33 characterized in that the emulsion is applied by at least one nozzle which is guided parallel to a longitudinal edge of the carrier material.

36. A process according to claim 33 characterized in that the center line of the coating area is oriented at an inclined angle relative to the longitudinal axis of the web, which is less than 30°.

37. A process according to claim 33 characterized in that each coating area comprises a plurality of substantially parallel coating strips wherein the coating strips are at an inclined angle with the center line of the coating area.

38. A process according to claim 37 characterized by an inclined angle of less than 30°.

39. A process according to claim 37 characterized in that each coating strip has a narrow edge which is associated with a respective contour line of the coating area.

40. A process according to claim 39 characterized in that the length of each coating strip is adapted to the position of the contour line which is determined by the inclined angle.

41. A process according to claim 39 characterized in that the center line of a clamping frame which is associated with the coating area and which is arranged at a spacing relative to the contour lines is put on to the center line of the contour of the coating area.

42. A process according to claim 41 characterized in that the clamping frame is glued to the screen web outside the coating area.

43. A process according to claim 41 in characterized in that an imperable layer which surrounds the coating area is applied to the screen web within the clamping frame.

44. A screen printing product comprising a screen web of plastic filaments which is coated with a photosensitive emulsion, which has been produced according to the process of claim 33 characterized in that the screen web is provided with coating areas composed of a plurality of coating strips.

45. A screen printing product according to claim 44 characterized in that the coating strips include an inclined angle to the center line of the coating area.

46. A screen printing product according to claim 44 characterized in that the coating strips extend at an inclined angle relative to the center line of a clamping frame receiving them.

47. A screen printing product according to claim 44 characterized in that the coating strips area comprise a plurality of substantially parallel coating strips which extend approximately parallel to the longitudinal axis of the screen web.

48. A screen printing product according to claim 44 characterized in that the screen web is provided with a liquid-impermeable layer of a cloth edge portion, said layer surrounding the coating area.

* * * * *